United States Patent

Dunaway et al.

[11] Patent Number: 5,891,745
[45] Date of Patent: Apr. 6, 1999

[54] TEST AND TEAR-AWAY BOND PAD DESIGN

[75] Inventors: Thomas J. Dunaway, New Hope; Richard K. Spielberger, Maple Grove, both of Minn.

[73] Assignee: Honeywell Inc., Minneapolis, Minn.

[21] Appl. No.: 946,403

[22] Filed: Oct. 7, 1997

Related U.S. Application Data

[63] Continuation of Ser. No. 591,365, Jan. 25, 1996, abandoned, which is a continuation of Ser. No. 331,314, Oct. 28, 1994, abandoned.

[51] Int. Cl.$^6$ .................................................. H01L 21/603
[52] U.S. Cl. ............................ 438/18; 438/106; 438/612
[58] Field of Search ............................... 438/18, 106, 612

[56] References Cited

U.S. PATENT DOCUMENTS

| | | | |
|---|---|---|---|
| 3,822,465 | 7/1974 | Frankort et al. . | |
| 4,581,706 | 4/1986 | Kato et al. . | |
| 4,845,543 | 7/1989 | Okikawa et al. | 257/784 |
| 4,926,238 | 5/1990 | Mukai et al. | 257/700 |
| 4,951,098 | 8/1990 | Albergo et al. | 347/17 |
| 5,053,700 | 10/1991 | Parrish | 324/158 |
| 5,057,900 | 10/1991 | Yamazaki | 257/753 |
| 5,132,772 | 7/1992 | Fetty | 257/786 |
| 5,150,193 | 9/1992 | Yasuhara et al. | 257/787 |
| 5,239,447 | 8/1993 | Cotues et al. | 361/744 |
| 5,263,246 | 11/1993 | Aoki . | |
| 5,286,927 | 2/1994 | Ueno et al. | 174/257 |
| 5,296,745 | 3/1994 | Shirai et al. | 257/786 |
| 5,327,834 | 7/1994 | Atkeson | 257/195 |
| 5,334,809 | 8/1994 | DiFrancesco | 200/262 |
| 5,336,649 | 8/1994 | Kinsman et al. | 437/209 |
| 5,342,807 | 8/1994 | Kinsman et al. | 437/209 |
| 5,358,904 | 10/1994 | Murakumi et al. | 437/209 |
| 5,391,516 | 2/1995 | Wojnarowski et al. | 437/174 |
| 5,432,807 | 7/1995 | Kinsman et al. | 437/209 |
| 5,506,499 | 4/1996 | Puar | 324/158.1 |
| 5,523,697 | 6/1996 | Farnworth et al. | 324/758 |
| 5,554,940 | 9/1996 | Hubacher | 324/765 |

FOREIGN PATENT DOCUMENTS

| | | | |
|---|---|---|---|
| 54-117681 | 9/1979 | Japan . | |
| 0098938 | 6/1983 | Japan | 257/786 |
| 0172757 | 9/1984 | Japan | 257/784 |
| 61-7638 | 1/1986 | Japan . | |
| 0101053 | 5/1986 | Japan | 257/786 |
| 0253847 | 11/1986 | Japan | 257/784 |
| 62-265730 | 11/1987 | Japan . | |
| 62-291127 | 12/1987 | Japan . | |
| 63-62339 | 3/1988 | Japan . | |
| 63-81938 | 4/1988 | Japan . | |
| 1-220850 | 9/1989 | Japan . | |
| 1-243532 | 9/1989 | Japan . | |
| 1-295444 | 11/1989 | Japan . | |
| 0040928 | 2/1990 | Japan | 257/786 |
| 2-40928 | 2/1990 | Japan . | |
| 3-153049 | 7/1991 | Japan . | |

*Primary Examiner*—David Graybill
*Attorney, Agent, or Firm*—Gregory A. Bruns

[57] ABSTRACT

A process of providing a bond pad arrangement for use with a thermocompression wire bonder including a primary bond pad for connection of an integrated circuit during a production assembly process, and a secondary test bond pad contiguous with the primary bond pad for connection of a wire to the integrated circuit. Including performing a test sequence, and removing the wire from the secondary test bond pad.

16 Claims, 3 Drawing Sheets

TEST AND TEAR-AWAY BOND PAD DESIGN

This application is a continuation of application Ser. No. 08/591,365, filed Jan. 25, 1996, abandoned; which application is a continuation of application Ser. No. 08/331,314, filed Oct. 28, 1994, abandoned.

BACKGROUND OF THE INVENTION

The present invention relates generally to full functional sting of an integrated circuit die before assembly, and particularly to an IC bond pad arrangement for making both a temporary or test connection and a permanent connection to the die.

There is an interest in performing full functional testing of ICs prior to packaging. This is due in part because of the cost associated with packaging even singular IC devices. However, in addition to singular IC devices there is increased interest in full functional testing of individual IC devices before the individual devices are assembled into multi-chip modules (MCMs).

In one approach to testing before packaging, it has been proposed that an ultrasonic wire bonder using a reduced bond foot size and reduced force can be used to effect a temporary bond that will allow the wire to be removed from the bonding pad, without damage to the bonding pad, by simply pulling the wire from the pad. One possible problem with this approach is that it may be difficult to achieve bonds having a sufficiently uniform low strength. Bonds of uniform strength are necessary so that 1) the wires can be consistently removed by a force that does not break the wire, and 2) the wires do not lift off during wire bonding. If the wire is broken, then a wire stub is left on the pad and this is likely to be objected to by the purchaser of the die and lifted bonds while bonding creat costly reworking. In addition, even if the wire is completely removed, there is some undesirable defacing of the bond pad surface.

Thus a need exists for a bond pad arrangement that provides for a reproducible and reliable temporary wirebond test connection, that allows the wire to be removed, and does not in any way affect the production assembly bond pad.

SUMMARY OF THE INVENTION

The present invention solves these and other needs by providing a bond pad arrangement or configuration for use with an ultrasonic or thermocompression wire bonder. The arrangement includes a primary bond pad for permanent connection of the IC during the production assembly process, and a secondary test or bond pad for a temporary connection of a wire to the IC. The secondary bond pad is contiguous with the primary bond pad and its length is defined by insulative material at opposite edges of the secondary bonding pad. The bonding foot of the ultrasonic bonder has a length substantially greater than the width of the secondary bonding pad, so that when the bonding energy is applied, the bonding foot forces the wire against the secondary controlled area bonding pad and forms a bond of reduced strength.

DESCRIPTION

Figure 1:
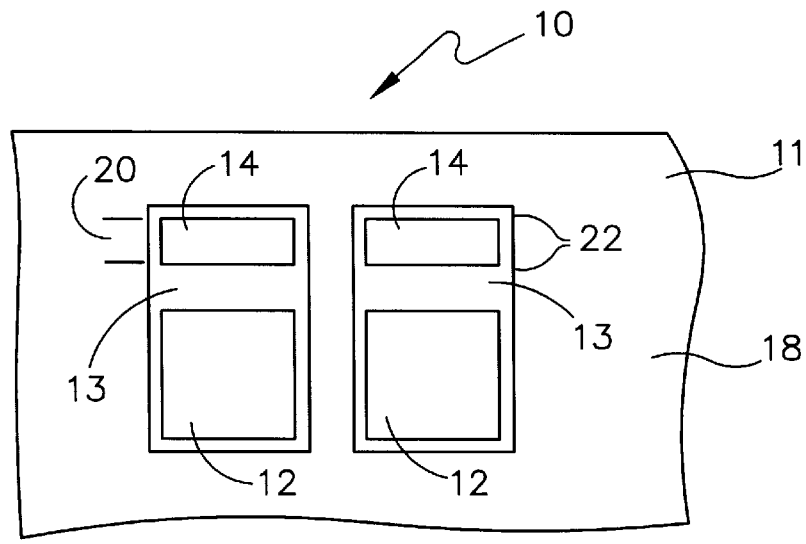
FIGS. 1, 1a, and 1b illustrate bond pad configurations according to the principles of the present invention.

A bond pad configuration or arrangement is shown in the drawings and generally designated 10. Configuration 10 includes a primary bond pad 12 and a secondary bond pad 14 on an IC chip 11. The primary bond pad may be referred to as a production assembly bond pad and the secondary bond pad may be referred to as a test bond pad. An insulation or passivation layer 18 overlays at least an outer edge portion of bond pad 12 and bond pad 14. Primary bond pad 12 is of a conventional shape and size. Secondary bond pad 14 is contiguous to bond pad 12 and has a length 20 which is defined by insulation layer 18 at opposite edges 22 of bond pad 14. Bond pad 14 is separated from bond pad 12 by an area 13 of insulative material 18.

Figure 1A:
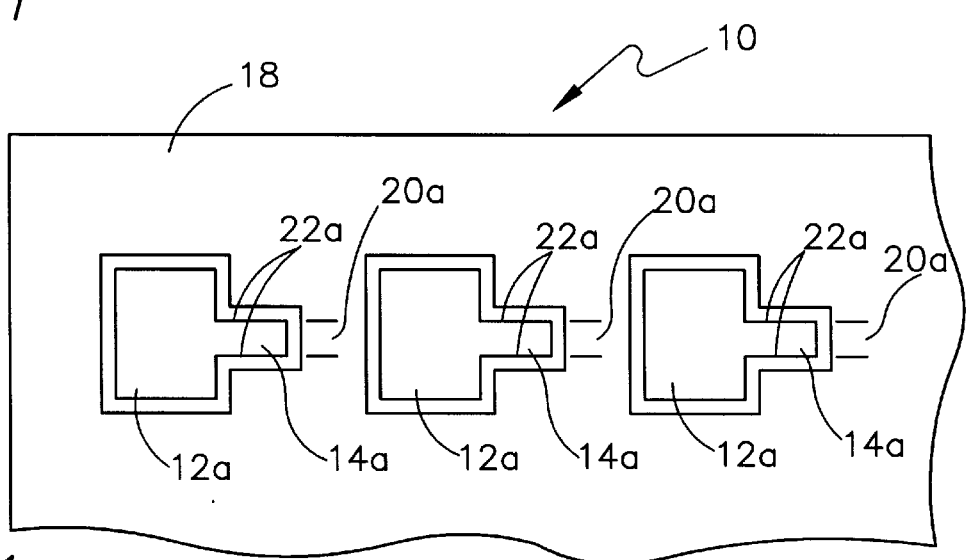

A first alternative configuration of a primary bond pad 12a and a secondary bond pad 14a is shown in FIG. 1a where the same numerals with the letter "a" are used for similar parts. Secondary bond pad 14a is contiguous to bond pad 12a and has a length 20a which is defined by insulation layer 18 at opposite edges 22a of bond pad 14a.

Figure 1B:
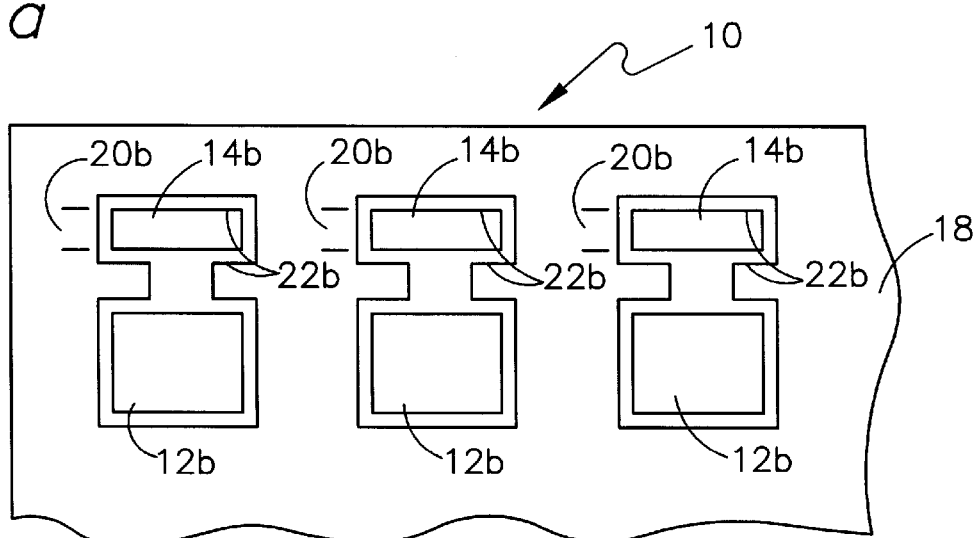

A second alternative configuration of a primary bond pad 12b and a secondary bond pad 14b is shown in FIG. 1b where the same numerals with the letter "b" are used for similar parts. Secondary bond pad 14b is contiguous to bond pad 12b and has a length 20b which is defined by insulation layer 18 at opposite edges 22b of bond pad 14b. In FIG. 1b secondary bond pad 14b protrudes from primary bond pad 12b. Other alternative arrangements are also possible.

Figure 2:
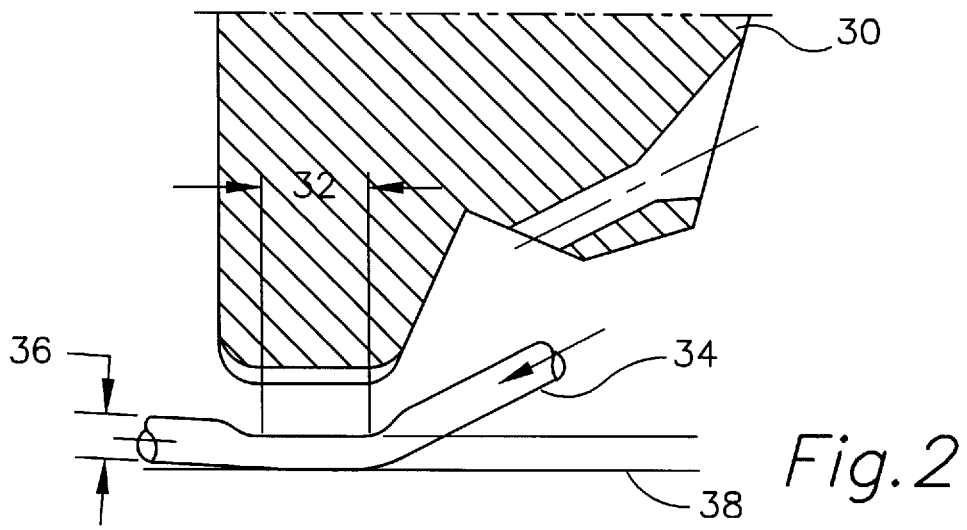
FIG. 2 shows a side view of a portion of a bonding tool and a wire that has been bonded.
Figure 2A:
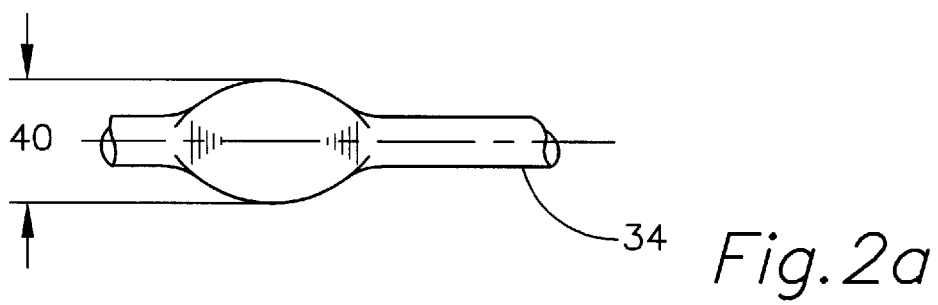
FIG. 2a shows a top view of the wire bond of FIG. 2.

In the ultrasonic bonding process, a metallurgical bond is formed through the transmittal of ultrasonic energy under pressure to the bond interface. FIG. 2 shows a side view of a typical bonding tool 30, having a bonding foot length 32. Also shown is a wire 34, of diameter 36 that has been bonded to a surface 38. FIG. 2a shows a top view of the bond of FIG. 1 which shows the plastic deformation of wire 34 so that at the bond it has a deformed width 40.

Figure 5:
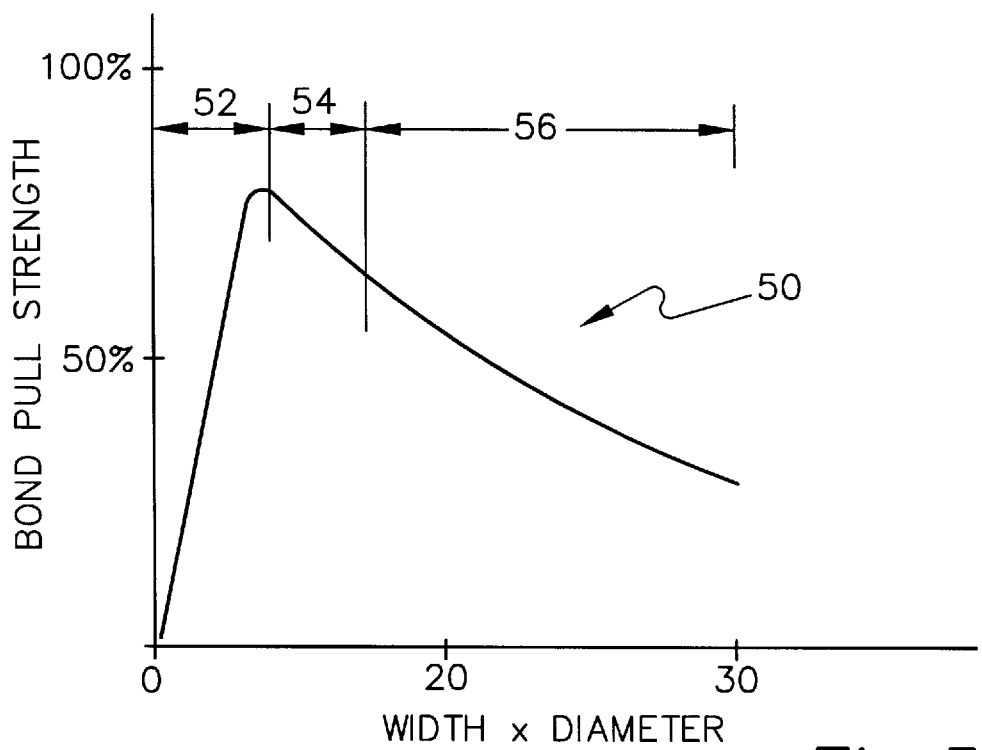
FIG. 5 is a plot of the relationship of bond pull strength to the deformed width of the bond as a function of either the ultrasonic power, clamping force or time.

FIG. 5 shows, for the ultrasonic bonding process and for a given bonding tool geometry and wire, the relationship of the bond pull strength, in percent of ultimate wire tensile strength, to the deformed width of the bond as a function of either the power, clamping force or time with one of these variables being varied and the other two being held constant. The curve 50 includes three regions of interest. The first region is a lift off region 52 where the bond pull strength varies rapidly with the deformed width and therefore provides a bond of somewhat uncertain strength. Bonds in this area are generally not reproducible. The second region is an optimum bonding region 54, i.e., it produces maximum reproducibility consistent with high bond strength which achieved when deformed width 40 is between 1.3 to 1.8 time wire diameter 38. The third region is the breakage region 56 where the bond has been deformed until portions are smashed and low bond pull strength results. Thus, it is desirable to use the robust portion of the bond strength versus bond squash functional curve to provide a wire bond having a deformed width between about 1.3 and 1.8 times the wire diameter.

Figure 3:
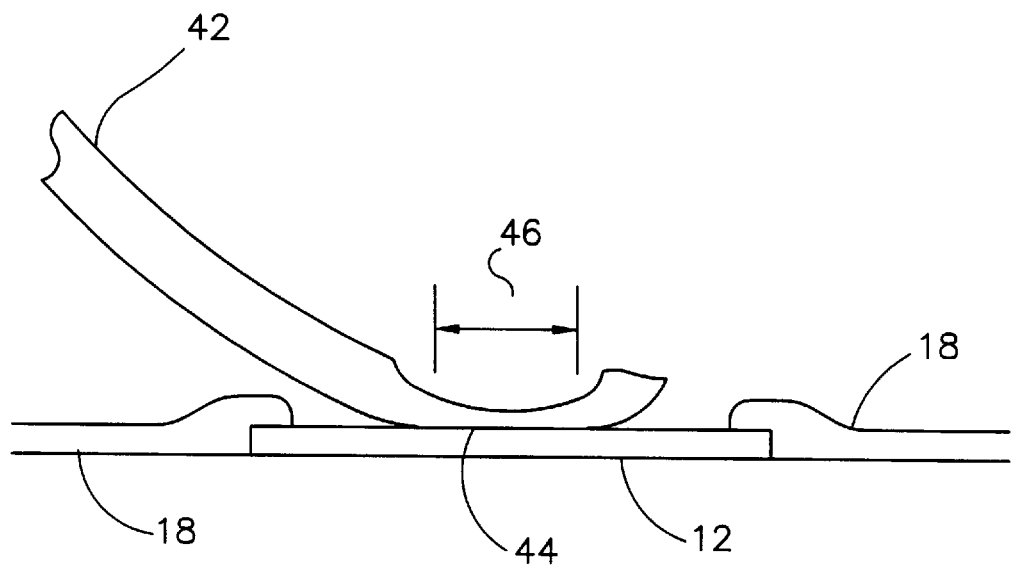
FIG. 3 is an enlarged side view of a conventional wirebond connection to a pad.

FIG. 3 shows a side view of a wire 42 that has been bonded to a production bonding pad, for example, pad 12. Pad 12 has an insulation or passivation layer 18, for example, silicon nitride, that overlays the perimeter of bond pad 12. Wire 42 is bonded to bond pad 12 in the usual way, that is, a normal bond 44 having a length 46 is made.

Figure 4:
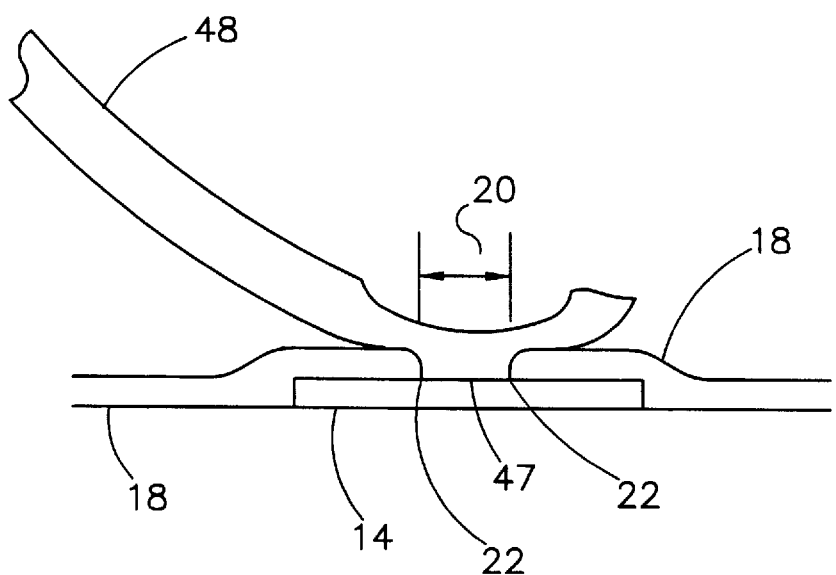
FIG. 4 is an enlarged side view of a wirebond connection to a pad in accordance with the principles of the present invention.

FIG. 4 shows a side view of a temporary or test connection of a conductor or wire 48 to a secondary or test bond pad, for example pad 14, according to the present invention. In FIG. 4, bond pad 14 has a length 20 defined by opposite edges 22 of insulation layer 18. Assume the wire bonder has a bonding foot 30 which has a length 32 which is substantially greater than length 20. Then, when bonding foot 30 is applied, it will force conductor 48 against both test bonding pad 14 and against insulative material 18. Through the application of ultrasonic energy, wire 48 will then form a metallurgical bond 47 only to bond pad 14. Although wire 48 will be deformed and forced against insulative material 18, no metallurgical bond is formed between wire 48 and insulative material 18, and the wire may be easily removed from bond pad 14 and from material 18 after the chip has been tested. This provides a full width bond to controlled area bonding pad 14 and assures a predictable and reproducible bond strength which will allow complete removal of the test wire so that no wire stub remains on the bond pad. Thus, configuration 10 allows a temporary connection to be formed between a test wire and a test bond pad by an ultrasonic wire bonder operating on a robust portion of the curve which represents wire bond strength versus bonding force. The present invention has been described with reference to an ultrasonic wire bonder but may also be used with a thermocompression or thermosonic wire bonding processes.

In accordance with the foregoing description, applicants have described a bond pad configuration that can be easily incorporated into an integrated circuit fabrication process.

Although applicants have described specific bond pad arrangements for illustrative purposes, a number of variations and modifications will be apparent to those of ordinary skill in the relevant arts. It is not intended that the coverage be limited to the disclosed arrangements, but only by the terms of the following claims.

We claim:

1. Method of connecting a leadwire to a semiconductor die for testing purposes whereby the leadwire may subsequently be removed, comprising the steps of:

providing a semiconductor die having a production assembly bond pad connected to an integrated circuit and a test bond pad, said test bond pad being contiguous with but separate from said production assembly bond pad, said test bond pad having a first length defined by insulative material at opposite edges of said test bond pad;

providing a leadwire;

providing a bonding means having a second length where said bonding means contacts said leadwire, said second length being substantially greater than said first length;

applying said bonding means to force said leadwire against both said test bond pad and said insulative material to form a metallurgical bond only at said test bond pad with said metallurgical bond having a strength sufficient to maintain an electrical connection during a test sequence;

performing said test sequence; and removing said leadwire from said test bond pad by mechanically applying a force to said leadwire while maintaining a connection between the test bond pad and the semiconductor die.

2. Method of claim 1 wherein said step of providing a semiconductor die comprises providing a semiconductor die having a bond pad configuration wherein an area of insulative material separates said test bond pad from said production assembly bond pad.

3. Method of claim 1 wherein said step of providing a semiconductor die comprises providing a semiconductor die wherein said test bond pad protrudes from said production assembly bond pad.

4. Method of claim 1 wherein said leadwire has a diameter and said step of applying comprises forcing said leadwire against said test bond pad, wherein at said metallurgical bond, said leadwire has a deformed width, said deformed width in the range of about 1.3 to 1.8 times said diameter.

5. Method of claim 2 wherein said step of providing a semiconductor die comprises providing a semiconductor die wherein said insulative material is silicon nitride.

6. Method of claim 1 wherein said step of applying said bonding means comprises applying ultrasonic, energy at said test bond pad.

7. Method of claim 1 where said step of providing a bonding means comprises providing a wedge bonding means.

8. Method of claim 1 wherein said step of providing a bonding means comprises providing a ball bonding means.

9. Method of connecting a leadwire to a semiconductor die for testing purposes whereby the leadwire may subsequently be removed, comprising:

providing a semiconductor die having a primary bond pad connected to an integrated circuit and a secondary bond pad, said secondary bond pad contiguous with but separate from said primary bond pad, said secondary bond pad having a first length defined by insulative material at opposite edges of said secondary bond pad;

providing a leadwire;

providing a bonding means having a second length where said bonding means contacts a leadwire, said second length substantially greater than said first length;

applying said bonding means to force said leadwire against both said secondary bond pad and said insulative material to form a metallurgical bond only at said secondary bond pad with said metallurgical bond having a strength sufficient to maintain an electrical connection during a test sequence;

performing said test sequence; and removing said leadwire from said secondary bond pad by mechanically applying a force to said leadwire.

10. Method of claim 9 wherein said leadwire has a diameter and said step of applying comprises forcing said leadwire against both said secondary bond and said insulative material to cause said leadwire to have a deformed width in the range of about 1.3 to 1.8 times said diameter.

11. Method of claim 9 wherein said step of providing a semiconductor die comprises providing a semiconductor die having a bond pad configuration wherein an area of insulative material separates said secondary bond pad from said primary bond pad.

12. Method of claim 9 wherein said step of providing a semiconductor die comprises providing a semiconductor die wherein said secondary bond pad protrudes from said primary bond pad.

13. Method of claim 9 wherein said step of providing a semiconductor die comprises providing a semiconductor die wherein said insulative material is silicon nitride.

14. Method of claim 9 wherein said step of applying said bonding means comprises applying ultrasonic energy at said secondary bond pad.

15. Method of claim 9 wherein said step of providing a bonding means comprises providing a wedge bonding means.

16. Method of claims 9 wherein said step of providing a bonding means comprises providing a ball bonding means.

* * * * *